United States Patent
Himmer et al.

(10) Patent No.: US 10,153,525 B2
(45) Date of Patent: Dec. 11, 2018

(54) ARRANGEMENT HAVING AN ELECTRICAL COMPONENT AND A HEAT EXCHANGER

(71) Applicant: Mahle Behr GmbH & Co. KG, Stuttgart (DE)

(72) Inventors: Thomas Himmer, Reichenbach (DE); Volker Schall, Hemmingen (DE); Christopher Laemmle, Stuttgart (DE); Stefan Hirsch, Stuttgart (DE); Oliver Heeg, Schwieberdingen (DE)

(73) Assignee: Mahle Behr GmbH & Co. KG (DE)

( * ) Notice: Subject to any disclaimer, the term of this patent is extended or adjusted under 35 U.S.C. 154(b) by 780 days.

(21) Appl. No.: 14/631,267

(22) Filed: Feb. 25, 2015

(65) Prior Publication Data

US 2015/0247684 A1 Sep. 3, 2015

(30) Foreign Application Priority Data

Mar. 3, 2014 (DE) .................... 10 2014 203 846

(51) Int. Cl.
| | |
|---|---|
| *H01M 10/653* | (2014.01) |
| *H05K 7/20* | (2006.01) |
| *F28D 21/00* | (2006.01) |
| *H01M 10/613* | (2014.01) |
| *F28F 3/12* | (2006.01) |
| *H01M 10/658* | (2014.01) |

(52) U.S. Cl.
CPC ... *H01M 10/653* (2015.04); *F28D 2021/0043* (2013.01); *F28F 3/12* (2013.01); *F28F 2265/24* (2013.01); *H01M 10/613* (2015.04); *H01M 10/658* (2015.04); *H05K 7/20472* (2013.01)

(58) Field of Classification Search
CPC .......... H05K 7/2039–7/20518; H01M 10/653; H01M 10/613; H01M 10/623
USPC .................................. 361/704–715
See application file for complete search history.

(56) References Cited

U.S. PATENT DOCUMENTS

| | | | | |
|---|---|---|---|---|
| 5,316,831 A | * | 5/1994 | Nakajima | H05K 1/056 428/209 |
| 2006/0243315 A1 | * | 11/2006 | Chrysler | H01L 23/38 136/201 |
| 2008/0037602 A1 | * | 2/2008 | Thiagarajan | H01S 5/02276 372/36 |
| 2010/0203657 A1 | * | 8/2010 | Kim | B29D 11/00278 438/23 |

(Continued)

FOREIGN PATENT DOCUMENTS

| | | |
|---|---|---|
| DE | 102011103984 A1 | 12/2012 |
| DE | 102011104000 A1 | 12/2012 |
| JP | 2012156124 A * | 8/2012 ......... B60H 1/00278 |

OTHER PUBLICATIONS

English abstract for DE-102011104000.
English abstract for DE-102011103984.
German Search Report for DE-102014203846.4, dated Sep. 17, 2014.

*Primary Examiner* — Zachary M Pape
(74) *Attorney, Agent, or Firm* — Fishman Stewart PLLC

(57) ABSTRACT

An arrangement may include an electrical component and a heat exchanger arranged on the electrical component for controlling a temperature of the component. An electrically insulating isolation layer may be arranged at least partially between the heat exchanger and the component. The isolation layer may be connected to at least one of the component and the heat exchanger via a materially cohesive connection.

10 Claims, 2 Drawing Sheets

(56) References Cited

U.S. PATENT DOCUMENTS

2011/0240279 A1* 10/2011 Furman .............. B23K 35/0238
165/185
2016/0322679 A1* 11/2016 Landerer ............. H01M 10/625

* cited by examiner

ARRANGEMENT HAVING AN ELECTRICAL COMPONENT AND A HEAT EXCHANGER

CROSS-REFERENCE TO RELATED APPLICATIONS

This application claims priority to German Patent Application No. 10 2014 203 846.4, filed Mar. 3, 2014, the contents of which are hereby incorporated by reference in their entirety.

TECHNICAL FIELD

The present invention relates to an arrangement having an electrical component and a heat exchanger for the temperature control of the electrical component.

BACKGROUND

Electrical components, in particular electrical energy storage devices, for example rechargeable or non-rechargeable batteries, are used in many applications. In many of these applications it is necessary to bring the electrical components to a desired temperature level before, during or after operation and to keep it at such a temperature level. To implement a corresponding temperature control of the electrical components, heat exchangers are commonly used, which can be configured in particular as heat exchanger plates. To prevent the heat exchanger and surrounding objects being energised, i.e. the transmission of electrical current and electrical voltage to the heat exchanger and objects, it is desirable to create electrical insulation between the electrical component and the generally electrically conductive heat exchanger. Such energisation can occur in particular if the electrical component and/or the heat exchanger is damaged, for example in an accident, in particular when used in a motor vehicle. To this end, electrically insulating isolation layers are usually used, which are arranged between the electrical component and the heat exchanger.

DE 10 2011 109 969 A1 discloses using a thermally conductive foil consisting of a plastic or ceramic as the isolation layer.

DE 10 2010 034 082 A1 proposes a thermally conductive foil or an electrically insulating, thermally conductive paste as the isolation layer.

The disadvantage of arrangements of electrical component and heat exchanger known from the prior art is that the connection or arrangement of the isolation layer is associated with high production costs and/or assembly costs. The isolation layers also have high thermal resistances, which result in inefficient temperature control of the electrical component. In addition, these arrangements have the disadvantage that thermal deformation of the electrical component and/or of the heat exchanger can occur owing to the compound of the isolation layer and/or of the temperature control system, which deformation can lead to corresponding damage and/or losses of mechanical contact in the arrangement.

SUMMARY

The present invention is concerned with the problem of specifying an improved or at least alternative embodiment for an arrangement of the above-mentioned type, which in particular has low production costs and/or an extended service life and/or more efficient temperature control and/or more efficient electrical insulation between the electrical component and the heat exchanger.

This problem is solved according to the invention by the subject matter of the independent claim. Advantageous embodiments form the subject matter of the dependent claims.

The present invention is based on the general concept of connecting an isolation layer, which is arranged between the electrical component and the heat exchanger in an arrangement of an electrical component and a heat exchanger that controls the temperature of the electrical component, in a materially cohesive manner to the heat exchanger and/or to the electrical component. The materially cohesive connection allows inexpensive production and assembly of the arrangement. Furthermore, a stable connection between the isolation layer and/or the electrical component and/or the heat exchanger can be realised thereby, so that the service life and stability of the arrangement is improved. The isolation layer is used for electrical insulation between the electrical component, or component for short, and the heat exchanger. In addition, the isolation layer is preferably thermally conductive and has a low thermal resistance, so that the heat exchanger between the component and the heat exchanger is impaired as little as possible by the isolation layer. The form-fitting connection of the isolation layer helps to minimise impairment of or even improve the thermal conduction between the heat exchanger and the component.

The materially cohesive connection of the isolation layer is preferably implemented on the heat exchanger side. This means that the isolation layer is connected in a materially cohesive manner to the heat exchanger at least in some regions. The arrangement can be assembled in such a manner that the isolation layer is already connected to the heat exchanger. Of course, it is also possible to connect the isolation layer in materially cohesive manner to the component, so that the isolation layer is already connected to the component before assembly of the arrangement. It is also conceivable that the isolation layer is a part or constituent of the heat exchanger or component owing to the corresponding materially cohesive connection.

Such a materially cohesive connection of the isolation layer can for example take place by adhesive bonding of the isolation layer. Adhesive bonding of the isolation layer allows a simple and/or inexpensive connection of the isolation layer. To this end, an inorganic adhesive, in particular an inorganic adhesive cement, is preferably used. It is also conceivable to use an organic adhesive that contains in particular silicone. The adhesive bonding of the isolation layer can likewise take place with the aid of a hot adhesive film. To improve the heat exchange, the adhesive preferably contains thermally conductive constituents, in particular thermally conductive particles.

In a preferred embodiment, the isolation layer is soldered, at least in some sections, for a materially cohesive connection. Soldering of the isolation layer is an inexpensive type of connection, which entails advantageous thermal conductivity properties. The soldering of the isolation layer can be implemented in any desired manner. In particular, the soldering can take place in air, in a protective gas, in particular argon and nitrogen, or in a vacuum.

Any desired types of soldering agents or solder for short can be used to solder the isolation layer. This includes in particular metals and metal alloys. In particular, the solder can contain silver, copper, zinc, tin, gold, silicon, aluminium and titanium. It is also conceivable to mix an oxide with the solder. The solder can be present in any desired form. It is conceivable to use the solder as a film or a paste. It is also conceivable to place, spread or spray the solder onto the corresponding surface.

The isolation layer can have a coating of metal, at least on one side. This means that the isolation layer can be metallised, at least on one side. The metallisation of the isolation layer in particular serves the purpose of realising an improved materially cohesive connection and/or an improved thermal conductivity. The metal coating or metallisation can be applied in a pointlike, line-like or segment-like manner. It is also conceivable to provide the isolation layer areally with such a metal layer, at least in some regions.

In further configurations, the isolation layer has at least one copper sheet oxidised thereon, which can also be oxidised on the isolation layer in a point-like, line-like, segment-like or areal manner. The copper sheet is preferably direct bonded copper. It is thus possible to produce a stable connection of the isolation layer and to make the thermal conductivity as effective as possible. In particular, the copper sheet makes it possible by means of the corresponding materially cohesive connection, to improve the conductivity owing to the fewest or lowest contact losses possible.

The metal layer and/or the copper sheet is preferably applied on the side of the isolation layer that faces the heat exchanger in order to avoid electrical contact between the electrical components and the isolation layer. The metal layer or copper sheet also serves the purpose of improving the diffusion barrier and of corrosion protection.

In preferred embodiments, the isolation layer contains the solder for soldering. This can be realised by adding solder to the isolation layer. It is also conceivable to use the metal coating and/or the copper sheet as solder. The solder can also contain glass or be configured as solder glass, so that the isolation layer corresponding contains glass. The provision of the isolation layer with solder results in the simplification of the production of the materially cohesive connection, since the use of special and external solder can be omitted.

To improve the connection of the solder and/or metal coating and/or copper sheet to the isolation layer, adhesion agents or adhesion promoters can also be provided. The adhesion agent or adhesion promoter is in particular applied to the isolation layer. The isolation layer can also contain adhesion promoters or adhesion agents.

The materially cohesive connection of the isolation layer can also be realised by producing the isolation layer on the heat exchanger and/or component, at least in some sections. In this case configurations are preferred in which the isolation layer is produced on the heat exchanger, in order to avoid damage to or adverse effects on the component. The production of the isolation layer on the heat exchanger or component at least in some sections means in particular that no separate connection, for example by soldering or adhesive bonding, is necessary. This results in reduced production costs. Furthermore, the production of the isolation layer on the heat exchanger or component results in an improved connection, so that the connection has improved stability and/or the thermal conductivity is improved. To this end, it is in particular conceivable to sinter, cast, fire, injection-mould the isolation layer.

The isolation layer can in principle be produced from any desired material or from any desired material composition. This includes for example ceramic, which is a suitable material for the isolation layer owing to its electrically insulating property with at the same time good thermal conductivity. The isolation layer then contains ceramic and is preferably configured as a ceramic. The ceramic is preferably present as a plate or preferably as a foil. Metal oxides, for example aluminium oxide, zirconium oxide and zirconium-reinforced aluminium oxide can be used as the ceramic. It is likewise conceivable to use metal nitrides, such as silicon nitride or aluminium nitride, as the ceramic. Hard porcelain or cordierite can likewise be used. Of course, it is also conceivable that the ceramic is composed of a mixture of the said materials. The ceramic can then be composed of solid particles, binders and/or solvents. For example, organic polymers are used as binders and volatile organic agents are used as solvents.

The ceramic-containing isolation layer or the isolation layer consisting of ceramic can be produced on the component or heat exchanger. Production preferably takes place on the heat exchanger. It is likewise possible to sinter the ceramic after it is applied to the heat exchanger or sinter it thereon. To this end, any desired sintering method can be used, for example hot pressing and/or spark plasma sintering (SPS).

In other embodiments, the isolation layer can be produced on the heat exchanger or component by applying such an isolation layer as a diamond coating, preferably on the heat exchanger. To this end, a microplasma diamond coating is preferably used, for example by means of chemical vapour deposition (CVD).

In further preferred embodiments, the materially cohesive connection of the isolation layer is realised by means of a nanofoil. The use of the nanofoil allows low voltages and/or currents to be used for the materially cohesive connection of the isolation layer, so that a protective connection takes place and damage to the isolation layer and/or heat exchanger and/or component is avoided or at least reduced. "Soldering with lightning" in particular is used to connect the isolation layer by means of the nanofoil.

In further embodiments, the isolation layer can contain glass and in particular be present as a glass foil or glass paste. In this case, the isolation layer that is in the form of a glass foil or glass paste is preferably soldered to the heat exchanger. It is also conceivable that the isolation layer is present as a glaze and is fired onto the component, but preferably onto the heat exchanger. A cost-effective and simple connection of the isolation layer is thus realised. The glass-containing isolation layer can also have adhesion promoters and/or solvents and/or binders.

In other embodiments, the isolation layer contains a silicon resin varnish. The silicon resin varnish preferably contains an epoxy resin. The silicon resin varnish is in particular in the form of a 2-component silicon resin varnish, in particular polyurethane and polysilazen. It is in particular conceivable for the isolation layer to be such a silicon resin varnish. The isolation layer is in this case connected with a corresponding heat treatment, as a result of which the silicon resin varnish connects to the heat exchanger or component. A protective and simple connection of the isolation layer is thereby possible.

The materially cohesive connection types of the isolation layer as explained above can each be present separately in order to realise the most inexpensive and/or thermally conductive isolation layer possible between the component and the heat exchanger, with an improved service life. Of course, it is also possible to combine said connection types as desired, where possible.

To reduce the negative effect of the isolation layer on heat exchange between the component and the heat exchanger, the isolation layer is preferably thin. The isolation layer in particular has thicknesses of less than 2 mm, preferably less than 1 mm, and very preferably between 0.05 mm and 1 mm.

The component can be any electrical component. In particular, the component can be used in mobile applications, for example in a vehicle. The component can be an electrical consumer, an electrical energy storage device or an electrical converter. The electrical component can in particular be a rechargeable or non-rechargeable battery.

If the electrical insulation is insufficient, there is a risk of a short circuit between the component and the heat exchanger. The isolation layer is then advantageously configured in such a manner that sufficient electrical insulation is ensured between the component and the heat exchanger. "Sufficient" in this case depends in particular on the application. With an electrical component that is used in a high-voltage range in a vehicle, in which electrical voltages of approx. 400 V occur, the isolation layer is for example configured in such a manner that it has a dielectric strength of approx. 1.5 KV-4 KV. To ensure the electrical insulation between the component and the heat exchanger, it can be necessary, in particular with thin isolation foils, for the isolation foil to be arranged areally and in particular over the entire area between the heat exchanger and the component.

The heat exchanger can be realised in any desired manner as long as it ensures heat exchange with the component. Heat exchange between the component and the heat exchanger is preferably realised as temperature control of the component, with which the component is cooled as required. This can be necessary in a component configured as an energy storage device in a vehicle, for example during operation of the vehicle, in order to prevent overheating of the component. The heat exchanger can likewise be used to heat up the component as required. Such a case can arise for example during or before starting of the corresponding application, in particular of the associated vehicle.

The heat exchanger is preferably plate-shaped, so that heat exchange having the highest possible efficiency and/or over the greatest possible area can take place between the heat exchangers or heat plate and the component. It is also conceivable for a fluid, in particular a coolant, to flow through the heat exchanger, in particular the heat plate. In these cases, there is an increased risk of energisation of the heat exchanger and of constituents connected to the heat exchanger, so electrical insulation between the component and the heat exchanger is more important.

Further important features and advantages of the invention can be found in the subclaims, the drawings and the associated description of the figures using the drawings.

It is self-evident that the above-mentioned features and those still to be explained below can be used not only in the combination given in each case but also in other combinations or alone without departing from the scope of the present invention.

Preferred exemplary embodiments of the invention are shown in the drawings and are explained in more detail in the description below, the same reference symbols referring to the same or similar or functionally equivalent components.

BRIEF DESCRIPTION OF THE DRAWINGS

In the figures.

DETAILED DESCRIPTION

Figure 1:
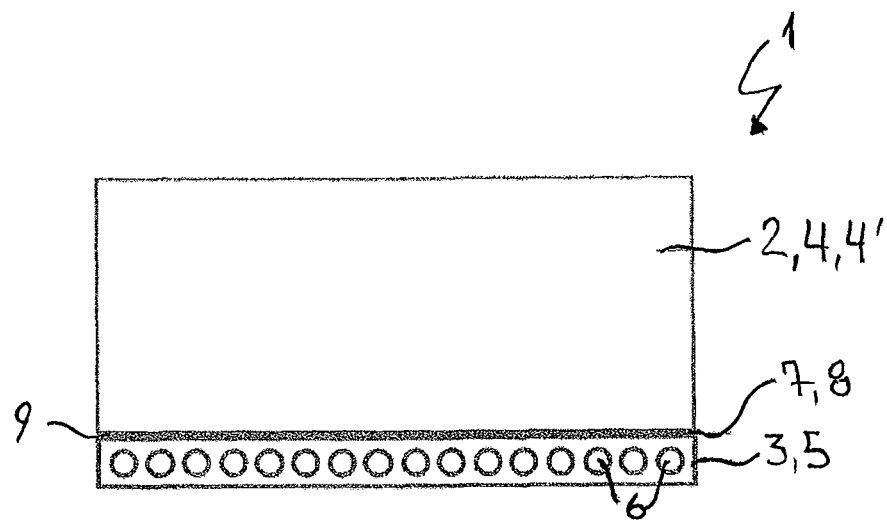
FIG. 1 schematically shows a section through an arrangement.

FIG. 1 shows an arrangement 1 having an electrical component 2 and a heat exchanger 3. The electrical component 2 is in the present case configured purely by way of example as a battery 4 or rechargeable battery 4'. The heat exchanger 3 is configured as a heat exchanger plate 5 and has a plurality of flow ducts 6, through which a coolant can flow. In the section shown, the electrical component 2, or component 2 for short, and the heat exchanger 3 are rectangular and dimensioned such that the mutually facing sides of the component 2 and of the heat exchanger 3 cover each other. The heat exchanger 3 is used for the temperature control of the component 2, in particular for cooling of the component 2. If the current-carrying or live component 2 is damaged, energisation of the heat exchanger 3 can occur, so the heat exchanger 3 is supplied with current or is live. In order to prevent or reduce such a risk, an electrically insulating isolation layer 7 is arranged between the component 2 and the heat exchanger 3. In the example shown, the isolation layer 7 separates the component 2 and the heat exchanger 3 over the entire contact area in order to prevent a corresponding electrical short circuit between the component 2 and the heat exchanger 3.

The isolation layer 7 is according to the invention connected in a materially cohesive manner to the component 2 or to the heat exchanger 3, the materially cohesive connection preferably being realised on the heat exchanger side. The isolation layer 7 is preferably formed as a foil 8 that has a thickness between 0.05 mm and 1 mm. The isolation layer 7 contains glass or ceramic. The isolation layer 7 can also have a silicon resin varnish 9.

FIGS. 2 to 5 show exploded diagrams of the arrangement 1, in which the component 2 is not shown.

Figure 2:
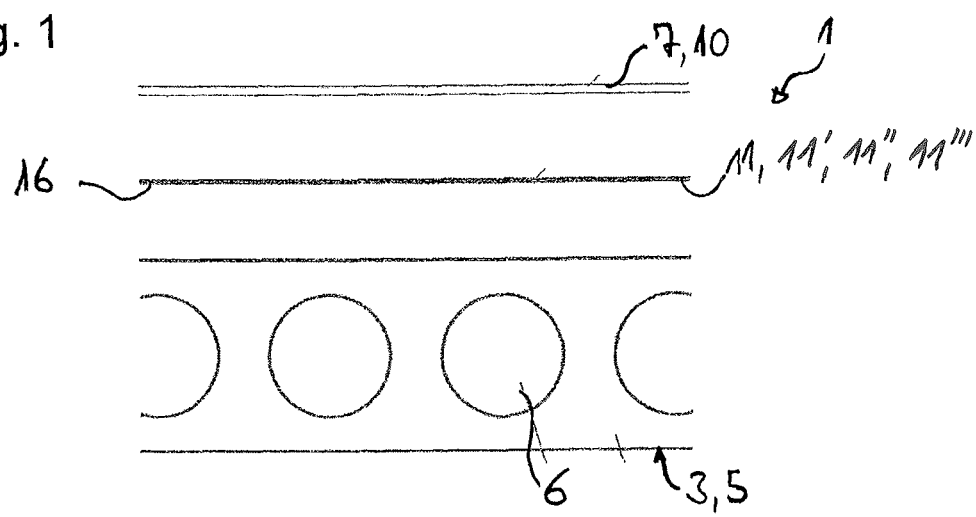
FIG. 2-FIG. 5 each schematically show an exploded diagram of a detail of FIG. 1.

In the exemplary embodiment shown in FIG. 2, the isolation layer 7 is formed as a ceramic foil 10. The materially cohesive connection of the ceramic foil 10 to the heat exchanger 3 takes place by soldering the ceramic foil 10 to the heat exchanger 3. To this end, a solder 11 is used, which is arranged areally between the ceramic foil 10 and the heat exchanger 3. The solder 11 can in this case be present in the form of a solder foil 11' or a solder paste 11". The solder 11 can be spread or sprayed onto the ceramic foil 10 or heat exchanger 3 and then used for soldering. For example, metals that can be mixed with oxides are used as solder materials. It is also conceivable to use a glass-containing solder 11 or a solder glass 11'''.

Figure 3:
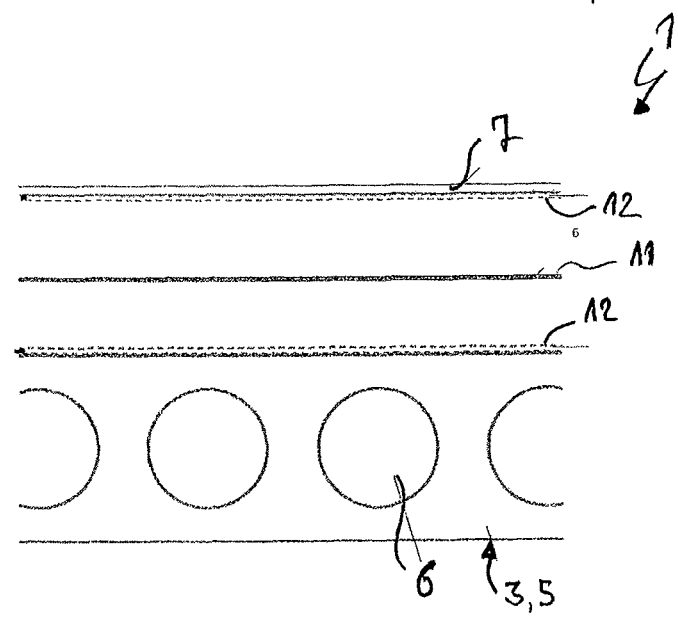

In the variant shown in FIG. 3, a layer of adhesion promoter 12 is also provided, which is applied to the side of the isolation layer 7 that faces the heat exchanger 3 and/or to the side of the heat exchanger 3 that faces the isolation layer 7. The adhesion promoter 12 improves the adhesion of the solder 11 or of the isolation layer 7 to the heat exchanger 3. In this case it is also possible to provide the solder 11 with such an adhesion promoter 12. The adhesion promoter 12 is distributed uniformly over the respective area in order to ensure a homogeneous connection.

Figure 4:
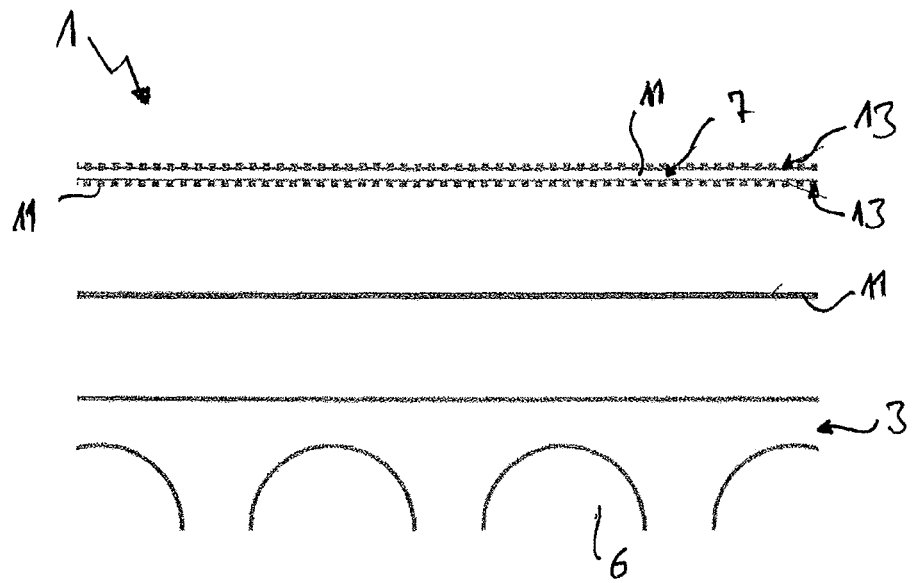

In the exemplary embodiment shown in FIG. 4, the isolation layer 7 is provided with a metal coating 13 on both sides, that is on the side facing the heat exchanger 3 and on the side facing the component 2. The metal coating 13 can be realised as a metallisation of the corresponding surfaces of the isolation layer 7 and in the example shown in distributed in a segment-like and homogeneous manner on the isolation layer 7. The thermal conductivity of the arrangement, in particular the thermal conductivity between the heat exchanger 3 and the isolation layer 7 and between the isolation layer 7 and the component 2, is improved by the application of the metal layer 13 to the isolation layer 7.

The metal layer 13 can also contain the solder 11, this being the case only if the metallisation is applied to the side of the isolation layer 7 that faces the heat exchanger 3, owing to the materially cohesive connection of the isolation layer 7 that is realised on the heat exchanger side. In this case, the areal solder 11 shown in FIG. 4 can be omitted, so that the production and assembly of the arrangement is simplified.

Figure 5:
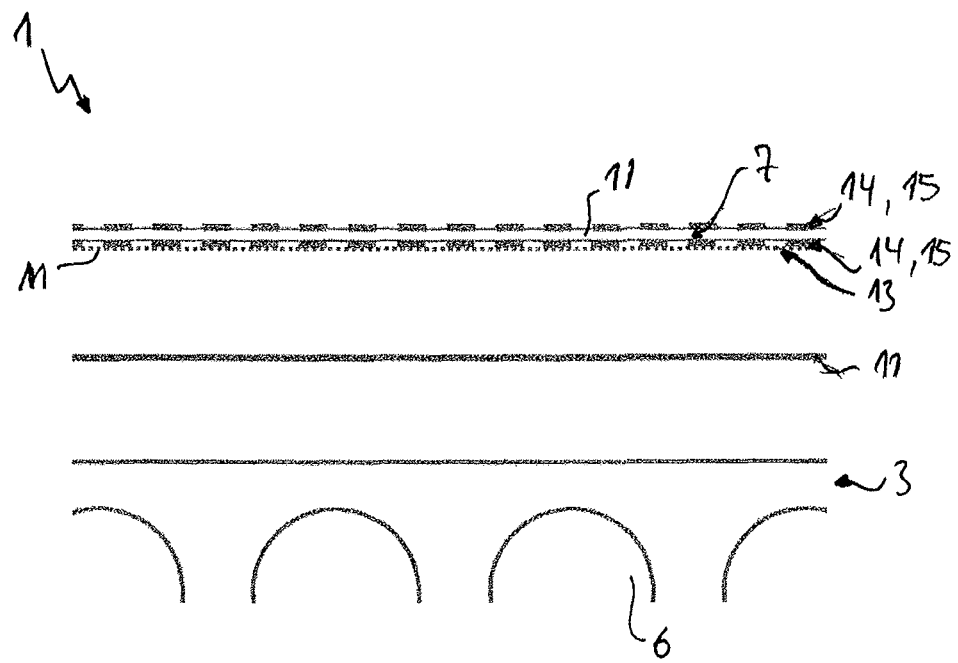

In the exemplary embodiment shown in FIG. 5, the isolation layer 7 is provided on both sides with a copper sheet 14 oxidised thereon, which is in each case oxidised on the isolation layer 7 in a segment-like and homogeneous manner. The copper sheet 14 oxidised thereon is preferably present as direct bonded copper 15. The connection of the isolation layer 7 and the thermal conductivity can thus be further improved. In the example shown in FIG. 5, an additional such metal layer 13 is applied to the copper sheet 14 on the side of the isolation layer 7 that faces the heat exchanger 3. In this case the metal layer 13 can in particular contain the solder 11, so that the solder 11 shown in FIG. 5 can be omitted.

In the variants shown above, adhesion promoters 12 can also be used, which for example allow an improved adhesion of the metal layer 13 or of the copper sheet 14 to the isolation layer 7.

Alternatively to the embodiments shown in FIGS. 4 and 5, the isolation layer 7 can be provided with solder 11 in order to dispense with the use of additional solder 11.

In the arrangement 1 shown in FIG. 1, the materially cohesive connection of the isolation layer 7 can also be realised by producing the isolation layer 7 on the component 2 or on the heat exchanger 3, preferably on the heat exchanger 3. The isolation layer 7, in particular the ceramic foil 10, can be produced by producing the ceramic foil 10 on the heat exchanger 3 by means of a sintering method, in particular press sintering.

As a further alternative for the materially cohesive connection of the isolation layer 7, a nanofoil 16 can be used instead of the solder 11 shown in FIG. 2. In this case the materially cohesive connection of the isolation layer 7 to the heat exchanger 3 or component 2 is realised by the use of low electrical currents or voltages ("soldering with lightning"). As mentioned above, the isolation layer 7 is connected in a materially cohesive manner to the heat exchanger 3. Then the side of the heat exchanger 3 that has the isolation layer 7 is brought into contact with the component 2, so that both electrical insulation is realised between the heat exchanger 3 and the component 2 and heat exchange is possible between the heat exchanger 3 and the electrical component 2.

The invention claimed is:

1. An arrangement, comprising:
   an electrical component and a heat exchanger arranged on the electrical component for controlling a temperature of the electrical component;
   an electrically insulating isolation layer arranged at least partially between the heat exchanger and the electrical component, the isolation layer connected to at least one of the electrical component and the heat exchanger via a materially cohesive connection; and
   wherein the isolation layer contains a silicon resin varnish, the silicon resin varnish including polyurethane and polysilazen.

2. The arrangement according to claim 1, wherein the isolation layer is soldered in a plurality of sections for the materially cohesive connection.

3. The arrangement according to claim 1, wherein the isolation layer has a metal coating on at least one side.

4. The arrangement according to claim 1, wherein the isolation layer is integrated at least partially on at least one of the heat exchanger and the electrical component for the materially cohesive connection.

5. The arrangement according to claim 1, wherein the electrical component is an electrical energy storage device.

6. The arrangement according to claim 1, wherein the isolation layer has a thickness of less than 2 mm.

7. The arrangement according to claim 1, wherein the isolation layer has a thickness of about 0.05 mm to 1.0 mm.

8. The arrangement according to claim 1, further comprising a metal coating disposed on at least one side of the isolation layer, wherein the metal coating includes a plurality of discrete metal segments spaced apart from one another along the isolation layer.

9. An arrangement for a vehicle, comprising:
   an electrical component;
   a heat exchanger mounted to the electrical component and configured to control a temperature of the electrical component;
   an isolation layer composed of an electrically insulating material arranged between the electrical component and the heat exchanger;
   a metal coating disposed on at least one side of the isolation layer, the metal coating including a plurality of discrete metal segments arranged spaced apart from one another along the isolation layer; and
   wherein the isolation layer is connected to at least one of the electrical component and the heat exchanger via a materially cohesive connection.

10. The arrangement according to claim 9, wherein the metal coating is disposed on a side of the isolation layer facing towards the heat exchanger, and wherein the metal coating contains a solder for the materially cohesive connection between the isolation layer and the heat exchanger.

* * * * *